(12) United States Patent
Bippus et al.

(10) Patent No.: US 11,196,901 B2
(45) Date of Patent: Dec. 7, 2021

(54) CAMERA MODULE

(71) Applicant: Rosenberger Hochfrequenztechnik GmbH & Co. KG, Fridolfing (DE)

(72) Inventors: Rainer Bippus, Teisendorf (DE); Johannes Schmid, Altötting (DE)

(73) Assignee: ROSENBERGER HOCHFREQUENZTECHNIK GMBH, Fridolfing (DE)

( * ) Notice: Subject to any disclaimer, the term of this patent is extended or adjusted under 35 U.S.C. 154(b) by 38 days.

(21) Appl. No.: 16/068,113

(22) PCT Filed: Jan. 22, 2016

(86) PCT No.: PCT/EP2016/051292
§ 371 (c)(1),
(2) Date: Jul. 4, 2018

(87) PCT Pub. No.: WO2017/125163
PCT Pub. Date: Jul. 27, 2017

(65) Prior Publication Data
US 2019/0028618 A1    Jan. 24, 2019

(51) Int. Cl.
*H04N 5/225* (2006.01)
*H01R 13/52* (2006.01)
(Continued)

(52) U.S. Cl.
CPC ....... *H04N 5/2252* (2013.01); *H01R 13/5202* (2013.01); *H04N 5/2253* (2013.01);
(Continued)

(58) Field of Classification Search
CPC .. H04N 5/2252; H04N 5/2253; H04N 5/2257; H05K 1/0213; H01R 13/5202; H01R 24/50
See application file for complete search history.

(56) References Cited

U.S. PATENT DOCUMENTS 5,340,009 A    8/1994 Vollert et al.
10,560,613 B2 *  2/2020 Conger ............... G06K 9/209
(Continued)

FOREIGN PATENT DOCUMENTS

EP    2541110 A2    1/2013
JP    H05196142 A    8/1993
(Continued)

OTHER PUBLICATIONS

JP 2015-222649 Translation (Year: 2015).*
Fukurama RFW-Series Motorsport Connectors, Corsa Technic website, Wayback Machine (Year: 2016).*

*Primary Examiner* — Twyler L Haskins
*Assistant Examiner* — Angel L Garces-Rivera
(74) *Attorney, Agent, or Firm* — David P. Dickerson

(57) ABSTRACT

The present invention relates to a camera module, for use in the automobile sector, with a printed circuit board assembly, the printed circuit board assembly comprising at least one printed circuit board and an image sensor; an interface for data transmission, which makes contact with the printed circuit board; a camera module housing, which has a peripheral wall; an interface-side covering element; a compensating element, which is arranged between the peripheral wall and the covering element; the compensating element being designed to seal the camera module housing and compensate for a clearance between the covering element and the peripheral wall. The present invention also relates to a motor vehicle with a camera module according to the invention and also to a method for producing it.

24 Claims, 3 Drawing Sheets

(51) Int. Cl.
*H05K 1/02* (2006.01)
*H01R 24/50* (2011.01)
(52) U.S. Cl.
CPC ......... *H04N 5/2257* (2013.01); *H05K 1/0213* (2013.01); *H01R 24/50* (2013.01)

(56) References Cited

U.S. PATENT DOCUMENTS

| | | |
|---|---|---|
| 2010/0321497 A1 | 12/2010 | Onishi et al. |
| 2013/0242099 A1 | 9/2013 | Sauer et al. |
| 2015/0029337 A1 | 1/2015 | Uchiyama et al. |
| 2015/0365569 A1 | 12/2015 | Mai et al. |

FOREIGN PATENT DOCUMENTS

| | | | |
|---|---|---|---|
| JP | H074525 A | | 1/1995 |
| JP | 200236978 A | | 2/2002 |
| JP | 201078772 A | | 4/2010 |
| JP | 2010078772 A | * | 4/2010 |
| JP | 2011109634 A | | 6/2011 |
| JP | 2013109188 A | | 6/2013 |
| JP | 2014142374 A | | 8/2014 |
| JP | 201526568 A | | 2/2015 |
| JP | 2015222649 A | | 12/2015 |
| WO | 201087270 A1 | | 8/2010 |
| WO | 2013085796 A1 | | 6/2013 |

\* cited by examiner

CAMERA MODULE

FIELD OF THE INVENTION

The present invention relates to a camera module for use in the automobile sector.

TECHNICAL BACKGROUND

Cameras in the automobile sector have long been a commonly used means for increasing safety and convenience for a motor vehicle driver. Such cameras must withstand considerable daily stresses as a result of dirt, water and mechanical loads.

To provide the required robustness of such a camera module, camera module housings are often produced from metal, in particular from aluminum.

However, housings made of metal, in particular of aluminum, have been found to be disadvantageous because of higher material costs and also considerable effects of wear in the case of metal-processing tools.

Against this background, WO 2013/085796 A1 discloses a radial seal for a camera housing made of plastic.

A disadvantage of this, however, is that a housing cover must be laboriously screwed to the housing at four fastening points. What is more, the housing cover must correspond precisely to prescribed dimensions. In particular, even if there are slight irregularities of the housing cover, difficulties are encountered when making contact between a printed circuit board and an interface and there are also leaks in the housing.

This is something to be improved.

SUMMARY OF THE INVENTION

Against this background, the present invention is based on the object of providing an improved camera module.

This object is achieved according to the invention by a camera module with the features of patent claim 1 and/or by a method with the features of patent claim 15.

Accordingly provided is:

A camera module, in particular for use in the automobile sector, with a printed circuit board assembly, the printed circuit board assembly comprising at least one printed circuit board and an image sensor; an interface for data transmission, which makes contact with the printed circuit board; a camera module housing, which has a peripheral wall; an interface-side covering element; a compensating element, which is arranged between the peripheral wall and the covering element; the compensating element being designed to seal the camera module housing and compensate for a clearance between the covering element and the peripheral wall.

A motor vehicle with a camera module according to the invention.

A production method for a camera module, which comprises the following steps: providing a camera module housing made of plastic, in particular of injection-molded plastic; providing a printed circuit board assembly, which comprises at least one printed circuit board and an image sensor; inserting the printed circuit board assembly into the camera module housing; providing an elastically radially deformable compensating element; fastening the compensating element to a covering element, which is designed to cover the camera module housing; inserting the covering element into the camera module housing, the compensating element hugging the camera module housing in the radial direction, whereby radially acting sealing of the camera module housing and compensation for the clearance between the covering element and the camera module housing are provided.

The idea on which the present invention is based is that of providing compensation for the clearance between the covering element and the camera module housing. Among the factors that are decisive for this is the minimization of axially acting forces, since axial forces can cause leakages in the camera module housing after prolonged use. What is more, axial compression of the components in a camera module housing often leads to damage during fitting. Accordingly, the compensating element according to the invention allows the axial forces necessary for sealing the camera module to be reduced and adequate seal-tightness to be achieved by a radially acting seal.

Advantageous configurations and developments are provided by the further dependent claims and by the description with reference to the figures of the drawing.

A compensating element according to the invention with a three-dimensional structure proves to be particularly advantageous. This ensures the flexible deformation and adaptation of the compensating element to a clearance between the coupling element and the peripheral housing wall.

Series of practical tests have shown that the radial deformability of the compensating element in a fitted state is advantageously between 0.001% and 2%, in particular between 0.005% and 1%, more particularly between 0.1% and 0.5%, of the diameter of the compensating element. Accordingly, the covering element hugs the housing wall and thus ensures maximum seal-tightness with maximum production tolerances.

The compensating element according to the invention advantageously has a lower degree of hardness than an O-ring of a comparable diameter. Suitable degrees of hardness for the compensating element according to the invention are in particular between 30 Shore and 50 Shore. A degree of hardness in the specified range ensures adequate flexibility of the compensating element, to compensate for the clearance between the covering element and the camera module housing.

A particularly suitable compensating element is formed as a three-dimensional lip seal. Lip seals have improved clearance sealing capabilities in particular in comparison with two-dimensional O-rings. Moreover, small amounts of water are helpful during sealing, in that water penetrates into the gap between the lips and presses the lip seal against the housing wall. Furthermore, lip seals have a longer service life, for example in comparison with O-rings.

Particularly advantageous is a substantially H- or dumbbell-shaped cross section of the compensating element. Accordingly, the compensating element has two parallel limbs and a central cross-piece between the limbs. This cross-sectional shape of the compensating element ensures a maximum possibility of adaptation of the compensating element to the inner housing contour.

In particular, the camera module according to the invention makes it possible for the covering element to be fastened on the housing at just two fastening points. This reduces labor costs and working steps in comparison with conventional camera modules with four fastening points.

According to a preferred embodiment, the camera module housing and/or the covering element is produced from plastic, in particular from injection-molded plastic. Plastic is a particularly low-cost material, which moreover does not harm the processing tools used.

According to a preferred embodiment, the camera module housing is produced from metal, in particular aluminum, and the covering element is produced from plastic. Apart from the aforementioned advantages, plastic can be easily shaped, even with a very filigree structure. Depending on the length of the operating times of the camera, a camera module housing made of metal with a better heat conducting capability than plastic is advantageous to avoid overheating of the camera module.

The dimensions of camera modules of the type in question are typically up to 50 mm×50 mm×70 mm, in particular up to 30 mm×30 mm×50 mm, more particularly up to 20 mm×20 mm×30 mm.

According to a preferred development, an EMC module, for example an EMC cage, is arranged between the printed circuit board assembly and the camera module housing.

The EMC module serves for shielding from external electromagnetic radiation and prevents electromagnetic waves from radiating through the camera module. This ensures reliable shielding of the electronics of the camera module, in particular in a plastic housing, and thus prevents any disturbance by electromagnetic interference.

According to a preferred development, the camera module housing has a depression in the region of the compensating element. The depression has the effect of reducing the risk of the housing being damaged by a printed circuit board during the fitting of the printed circuit board assembly. Any damage, in particular scratches, in the housing may mean that sealing of the camera module housing by the compensating element is no longer ensured.

If appropriate, the above configurations and developments can be combined with one another in any way desired. Further possible configurations, developments and implementations of the invention also comprise combinations not explicitly mentioned of features of the invention that are described above or below with respect to the exemplary embodiments. In particular, a person skilled in the art will in this respect also add individual aspects as improvements or additions to the respective basic form of the present invention.

CONTENT OF THE DRAWING

The present invention is explained in more detail below on the basis of the exemplary embodiments indicated in the schematic figures of the drawing, in which.

Figure 1:
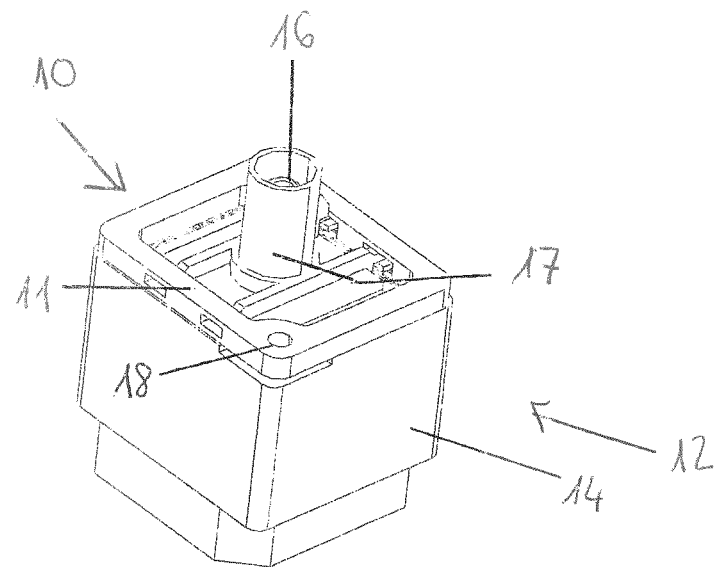
FIG. 1 shows a perspective view of an embodiment of a camera module according to the invention.

The accompanying figures of the drawing are intended to convey further understanding of the embodiments of the invention. They illustrate embodiments and serve in connection with the description for explaining principles and concepts of the invention. Other embodiments and many of the advantages mentioned are evident from viewing the drawings. The elements of the drawings are not necessarily shown to scale in relation to one another.

In the figures of the drawing, elements, features and components that are the same, functionally the same and act the same are respectively provided with the same designations—unless otherwise stated.

DESCRIPTION OF EXEMPLARY EMBODIMENTS

FIG. 1 shows a schematic perspective view of an embodiment of a camera module 10 according to the invention. The camera module 10 has a covering element 11 and a camera module housing 12 with a peripheral wall 14. The covering element 11 includes an interface 16, which is arranged in an interface enclosure 17. The interface may be formed for example as a Fakra, HSD, MTD or similar interface.

In FIG. 1, the covering element 11 is screwed to the camera module housing 12 at two fastening points or holes 18.

Figures 2A, 2B:
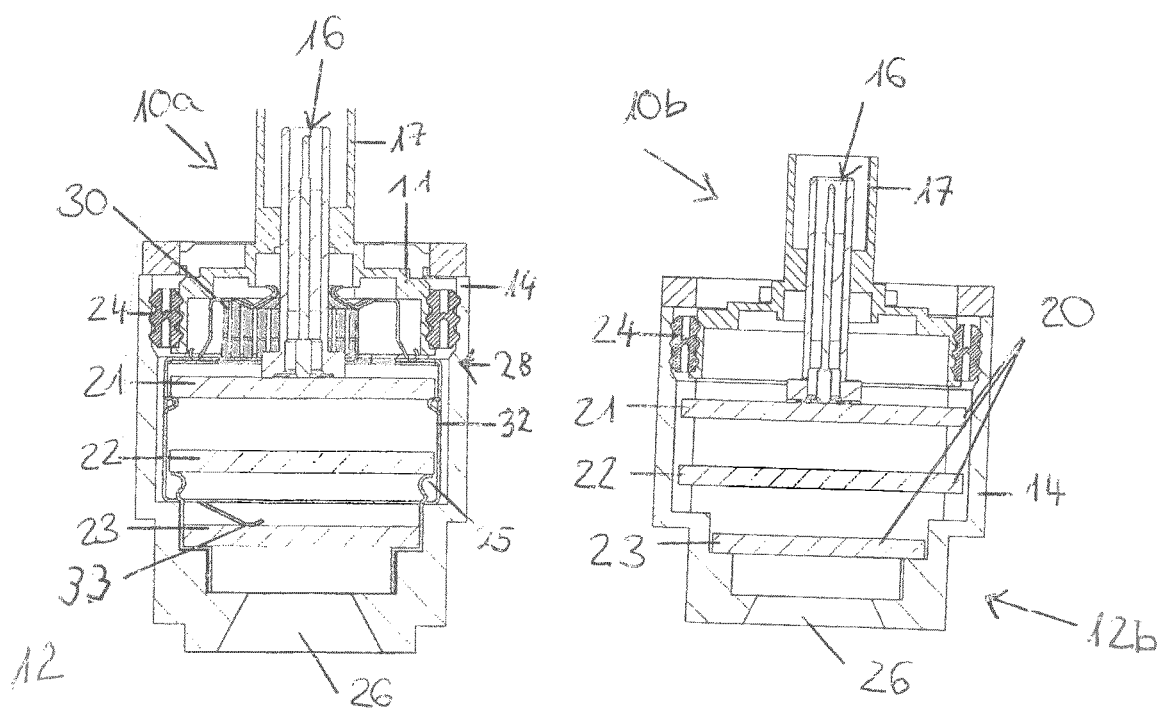
FIG. 2a shows a sectional view of an embodiment of a camera module according to the invention.
FIG. 2b shows a sectional view of an embodiment of a camera module according to the invention.

FIG. 2a shows a schematic sectional view of an embodiment of a camera module 10a according to the invention. In a way corresponding to the camera module 10 from FIG. 1, the camera module 10a in FIG. 2a comprises a covering element 11, a camera module housing 12 made of plastic and also an interface 16. Moreover, in FIG. 2a, the printed circuit board assembly 20 is shown with the printed circuit boards 21, 22 and 23, the compensating element 24, the lens 26, the EMC module 28, which is formed as an EMC body, and also a contact element 30, which is formed here as a spring cage.

In FIG. 2a, the interface 16 is formed as a Fakra interface. The Fakra interface makes contact with the printed circuit board 21, within the EMC body 28, and may be connected to it directly or connected by way of a connector portion. Arranged within the EMC body 28 is a second printed circuit board 22 for signal processing. The two printed circuit boards 21, 22 lie on steps 25. The steps 25 may also be optionally used as contact points for the EMC module 28. Furthermore, a third printed circuit board 23 is arranged opposite the lens 26. The third printed circuit board 23 comprises an image sensor (not shown) and makes contact with the EMC body by the contact 33.

The covering element 11 is inserted in the camera module housing 12. The compensating element 24 is positioned between the peripheral wall 14 of the camera module housing 12. In the embodiment according to FIG. 2a, the compensating element 24 is formed as an H-shaped three-lip seal. A central cross-piece between two limbs of the three-lip seal ensures the maximum deformability of the three-lip seal, with at the same time minimal loading of the seal.

The compensating element 24 achieves the effect that the covering element 11 is connected to the camera module housing 12 in a splashproof manner. Moreover, the compensating element 24 ensures sufficient clearance tolerance to ensure exact positioning of the interface 16 on the printed circuit board. The exact positioning is important, in particular for the contacting of the interface 16 with the printed circuit board 21, since even very small displacements of the covering element 11 lead to contacting problems.

In FIG. 2a, the EMC module 28 is of a two-part form. The EMC module 28 comprises a lens-side wall, made of conductive material, and a covering-element-side contact element 30. The lens-side wall may in particular also be of a multi-part form. The contact element 30 has spring-elastic contacts 31, which make contact with the wall 32.

FIG. 2b shows a further embodiment of a camera module 10b according to the invention. The camera module 10b comprises a camera module housing 12b, which however, by contrast with the camera module housing 12 from FIG. 2a, is produced from aluminum. Consequently, the camera module housing 12b already serves for shielding, and an additional EMC body is not absolutely necessary.

Both in FIG. 2a and in FIG. 2b, the wall 14 of the camera module housing 10a, 10b has a depression 52, to prevent the wall 14 of the camera module housing from being scratched during the fitting of the printed circuit boards 21, 22 or 23. Any damage to the wall 14 may be contrary to the seal-tightness of the camera module housing.

Figure 3:
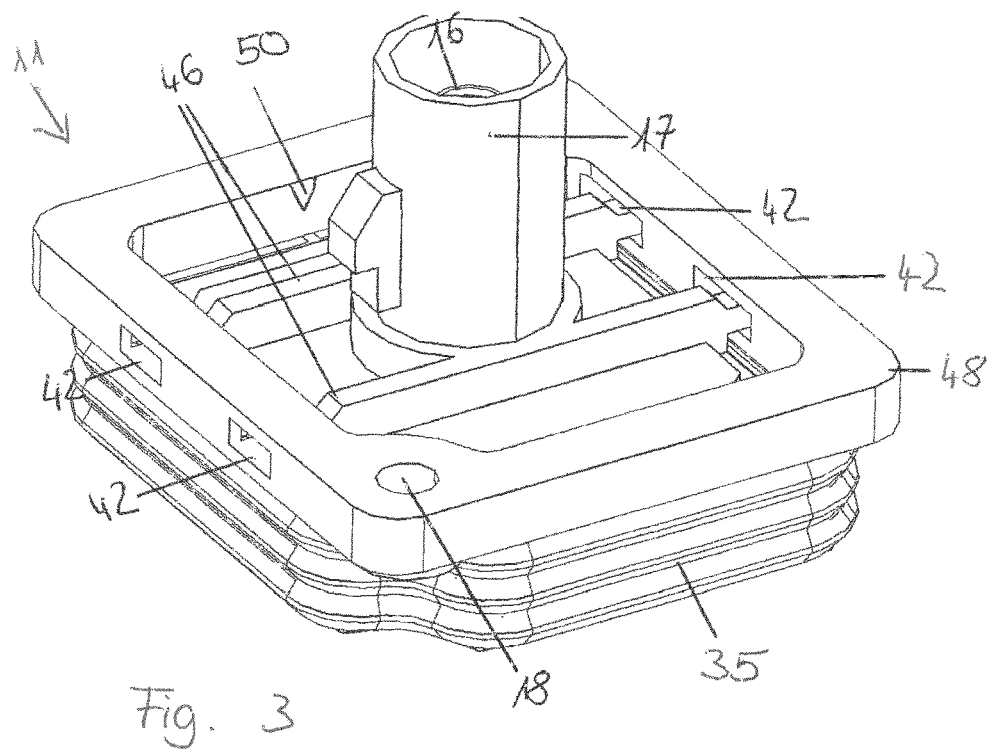
FIG. 3 shows a perspective plan view of an embodiment of a covering element according to the invention.

FIG. 3 shows a perspective plan view of a covering element 11 according to the invention with a functional element 50 and a fixing frame 48. The fixing frame 48 has two holes 18, to screw the covering element 11 to a camera module housing. The fixing frame 48 has on each of two opposite sides two apertures 42, in which the functional element 50 is suspended by webs 46. The functional element 50 comprises by way of example a Fakra interface 16, a compensating element 35 and also the contact element 30 for EMC shielding. The Fakra interface 16 and the contact element 30 are arranged on the functional element 50. The mounting with play of the webs 46 in the apertures 42 allows the interface 16 to be aligned in the functional element 50 with the board 21.

In FIG. 3, the compensating element 35 is formed as a simple three-lip seal. The covering element 11 is adhesively bonded to the compensating element 35. However, it goes without saying that fastening of the compensating element 35 on the covering element 11 is not absolutely necessary. Furthermore, fastening does not necessarily have to be performed by adhesive bonding.

To follow the inner contours of a camera module housing, the covering element 11 has an aperture at each of two corners, at which the holes 18 are formed.

Figure 4:
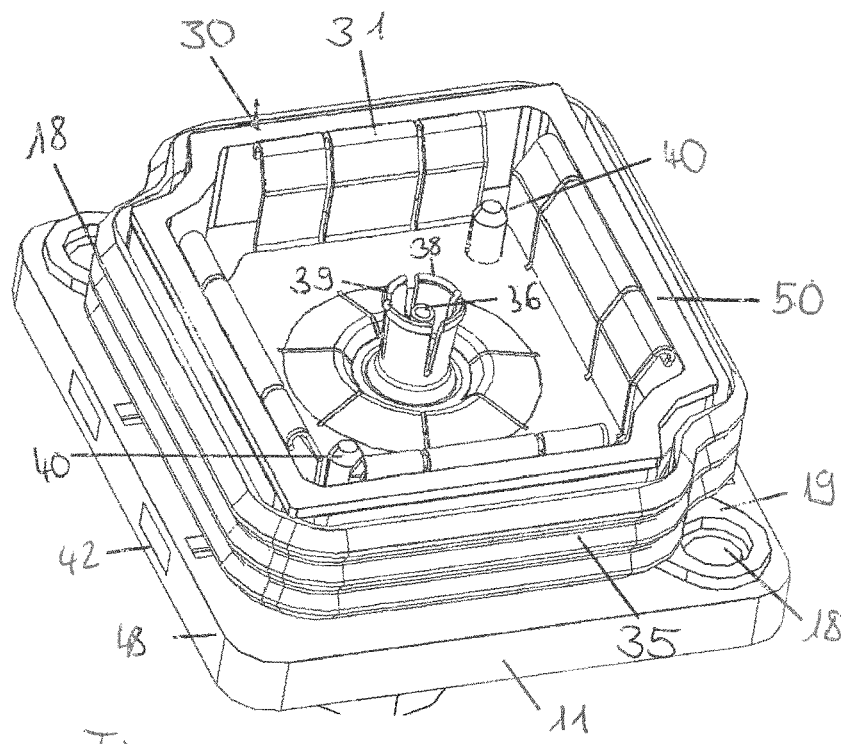
FIG. 4 shows a perspective view from below of a covering element of a camera module according to the invention.

FIG. 4 shows a covering element 11 according to FIG. 3 in a perspective view from below. To position the functional element 50 easily and unerringly with respect to the fixing frame 48 and the camera module housing (not shown in FIG. 4), the functional element 50 has an eyelet 19 at each of two corners.

In FIG. 4, the outer conductor 38 and the inner conductor 36 of the Fakra interface 16 can be seen. The outer conductor has four slits, to ensure sufficient elasticity for a connection on a printed circuit board. The outer conductor 38 has a locking ring 39, which is suitable for locking with a connector portion of a printed circuit board (not shown).

FIG. 4 also shows the contact element 30 of the EMC module 28. The contact element 30 has a number of resilient contact strips 31, which in the fitted state make contact with the wall 32 of the EMC module 28. The contact strips 31 and the wall 32 are designed in such a way that they spring back from one another in the fitted state. This is achieved by the contact strips 31 being produced from a thin or easily deformable conductive material.

To facilitate fitting, the functional element 50 of the covering element 11 has two centering aids 40 at two corners. The centering aids 40 also prevent the contact element 30 from being twisted or inserted the wrong way round into the covering element. In this respect, it is advantageous in particular if the centering aids 40 differ from one another.

In FIG. 4 it is shown that the contact element 30 makes contact with the outer conductor 38 of the interface.

Figure 5:
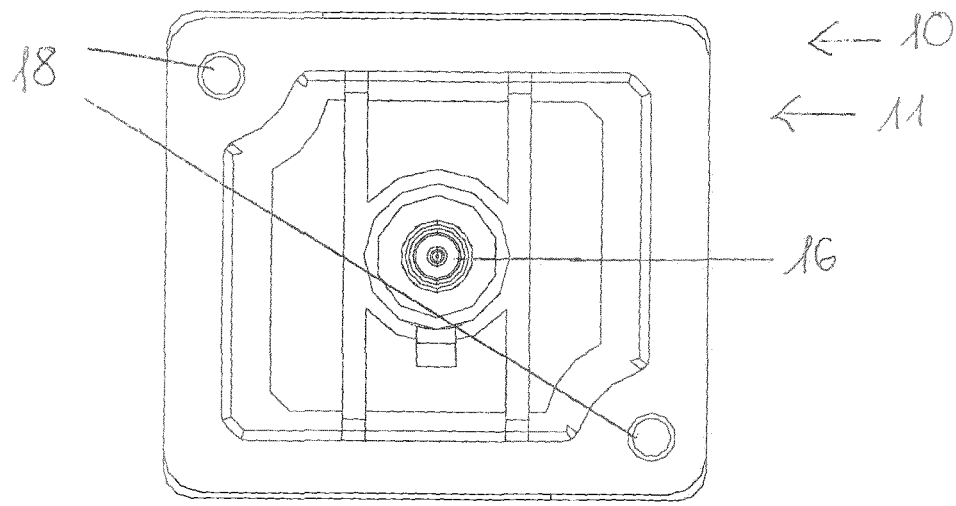
FIG. 5 shows a schematic plan view of an embodiment of a camera module according to the invention.

FIG. 5 shows a schematic plan view of a camera module 10 according to the invention of the first embodiment in FIG. 1.

Figure 6:
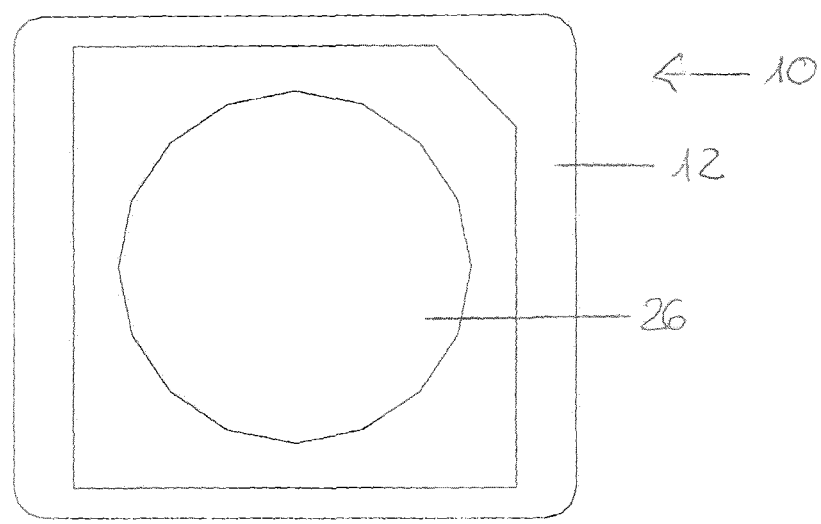
FIG. 6 shows a schematic view from below of an embodiment of a camera module according to the invention.

FIG. 6 shows a schematic view from below of a camera module 10 according to the invention of the first embodiment in FIG. 1. Apart from the camera module housing 10 with the peripheral wall 12, also shown in FIG. 6 is the lens 26.

Although the present invention has been completely described above on the basis of preferred exemplary embodiments, it is not restricted to these, but can be modified in many varied ways.

LIST OF REFERENCE SIGNS

10 Camera module
10a Camera module
10b Camera module
10c Camera module
11 Covering element
12 Camera module housing
12b Camera module housing
14 Peripheral wall
16 Interface
17 Interface enclosure
18 Fastening point
20 Printed circuit board assembly
21 Printed circuit board
22 Printed circuit board
23 Printed circuit board
24 Compensating element
25 Step
26 Lens
28 EMC module
30 Contact element
32 Wall
33 Contact
35 Compensating element
36 Inner conductor
38 Outer conductor
40 Centering element
42 Aperture
46 Web
48 Fixing frame
50 Functional element
52 Depression

The invention claimed is:
1. A camera module, comprising:
a housing;
an image sensor situated in said housing;
a printed circuit board situated in said housing and electrically connected to said image sensor;
a cover that supports a connector electrically connected to said printed circuit board; and
a frame that retains said cover on said housing, wherein
said cover is movable along each of a plurality of distinct parallel axes from a non-sealing configuration in which said cover does not seal an opening of said housing to a sealing configuration in which said cover seals said opening,
in said sealing configuration said cover is movable relative to said frame,
in said non-sealing configuration neither said frame nor said cover is connected to said housing and
in said non-sealing configuration said cover is movably connected to said frame.

2. The camera module of claim 1, wherein:
each of said plurality of distinct parallel axes are perpendicular to a major face of said printed circuit board.
3. The camera module of claim 1, wherein:
in said sealing configuration, a longitudinal axis of said connector is perpendicular to a major face of said printed circuit board.
4. The camera module of claim 1, wherein:
said cover comprises a seal that, in said sealing configuration, seals a gap between an inner circumferential wall of said housing and an outer circumferential wall of said cover.
5. A camera module, comprising:
a housing;
an image sensor situated in said housing;
a printed circuit board situated in said housing and electrically connected to said image sensor; and
a cover that supports a connector electrically connected to said printed circuit board;
a first electromagnetic shield situated in said housing; and
a second electromagnetic shield fastened to said cover; and
a seal, wherein
in a sealing configuration, said seal seals a gap between an inner circumferential wall of said housing and an outer circumferential wall of said cover,
in said sealing configuration, said cover is movable in a direction relative to said housing in a direction parallel to a major face of said printed circuit board, and
in said sealing configuration, said first electromagnetic shield electrically contacts said second electromagnetic shield.
6. The camera module of claim 5, wherein:
in said sealing configuration, a longitudinal axis of said connector is perpendicular to a major face of said printed circuit board.
7. The camera module of claim 5, comprising:
a mount that retains said cover on said housing, wherein
in said sealing configuration said cover is movable relative to said mount.
8. The camera module of claim 7, wherein:
in a non-sealing configuration said cover is movably connected to said mount.
9. The camera module of claim 5, wherein:
said seal comprises an outward-facing surface and an inward-facing surface,
said outward-facing surface comprises a plurality of sealing lips that sealingly contact said inner circumferential wall, and
said inward-facing surface comprises a plurality of sealing lips that sealingly contact said outer circumferential wall.
10. The camera module of claim 5, wherein:
said seal comprises a first wall, a second wall and a cross-piece,
said first wall comprises a plurality of lips that sealingly contact said inner circumferential wall,
said second wall comprises a plurality of lips that sealingly contact said outer circumferential wall, and
said cross-piece extends from said first wall to said second wall in a direction substantially perpendicular to said first wall, interconnecting said first wall and said second wall in a generally "H"-shaped configuration.

11. A camera module, comprising:
a housing;
an image sensor situated in said housing;
a printed circuit board situated in said housing and electrically connected to said image sensor;
a seal; and
a cover assembly, wherein
said cover assembly comprises a frame and a cover,
said frame comprises a first plurality of engagement structures,
said cover comprises an electrical connector and a second plurality of engagement structures,
said cover is movably connected to said frame by an interaction of said first plurality of engagement structures and said second plurality of engagement structures, and
in a sealed configuration of said cover assembly and said housing, said seal and said cover collectively seal an opening of said housing.
12. The camera module of claim 11, wherein:
said interaction delimits a motion of said cover relative to said frame substantially to a plane perpendicular to a connection direction of said electrical connector.
13. The camera module of claim 11, wherein:
in said sealed configuration, said electrical connector extends from a sealed interior of said housing to an exterior of said housing.
14. The camera module of claim 11, wherein:
in said sealed configuration, said electrical connector is electrically connected to said printed circuit board.
15. The camera module of claim 11, wherein:
in an unsealed configuration of said cover assembly and said housing, said cover assembly is separated from said housing, and
in said unsealed configuration, said cover is movably connected to said frame by said interaction of said first plurality of engagement structures and said second plurality of engagement structures.
16. The camera module of claim 11, wherein:
at least one of said first plurality of engagement structures and said second plurality of engagement structures comprises an aperture, and
at least one of said first plurality of engagement structures and said second plurality of engagement structures comprises a projection that extends into said aperture.
17. The camera module of claim 11, wherein:
said frame comprises a plurality of apertures that collectively constitute said first plurality of engagement structures,
said cover comprises a plurality of projections that collectively constitute said second plurality of engagement structures,
each of said plurality of projections extends into a respective one of said plurality of apertures, and
each of said plurality of projections is rigidly connected to said electrical connector.
18. The camera module of claim 11, wherein:
in said sealed configuration, said seal is abuttingly situated between an inward-facing circumferential surface of said housing and an outward-facing circumferential surface of said cover.
19. The camera module of claim 18, wherein:
said seal comprises a first plurality of lips and a second plurality of lips,
in said sealed configuration, each of said first plurality of lips abuts said inward-facing circumferential surface, and in said sealed configuration, each of said second plurality of lips abuts said outward-facing circumferential surface.

20. The camera module of claim 19, wherein:
said seal comprises a first wall, a second wall and a cross-piece,
said cross-piece interconnects said first wall and said second wall in a generally "H"-shaped configuration,
said first wall supports said first plurality of lips, and
said second wall supports said second plurality of lips.

21. The camera module of claim 11, wherein:
said housing is an electrically conductive housing.

22. The camera module of claim 11, comprising:
a first electromagnetic shield situated in said housing; and
a second electromagnetic shield fastened to said cover, wherein
in said sealed configuration, said first electromagnetic shield electrically contacts said second electromagnetic shield.

23. The camera module of claim 22, wherein:
in said sealed configuration, said first electromagnetic shield and said second electromagnetic shield collectively shield said printed circuit board.

24. The camera module of claim 11, wherein:
said electrical connector is a coaxial connector.

* * * * *